(12) United States Patent
Sikdar et al.

(10) Patent No.: US 12,713,736 B2
(45) Date of Patent: Aug. 18, 2026

(54) ENHANCED LIGHT EXTRACTION FROM LIGHT EMITTING DIODES UTILIZING A NANOPARTICLE META-GRID

(71) Applicant: IMPERIAL COLLEGE INNOVATIONS LIMITED, London (GB)

(72) Inventors: Debabrata Sikdar, London (GB); Alexei Kornyshev, London (GB); Joshua Edel, London (GB); John Brian Pendry, London (GB)

(73) Assignee: Imperial College Innovations Limited, London (GB)

( * ) Notice: Subject to any disclaimer, the term of this patent is extended or adjusted under 35 U.S.C. 154(b) by 801 days.

(21) Appl. No.: 17/861,441

(22) Filed: Jul. 11, 2022

(65) Prior Publication Data

US 2023/0015425 A1 Jan. 19, 2023

Related U.S. Application Data

(60) Provisional application No. 63/221,575, filed on Jul. 14, 2021.

(51) Int. Cl.
*H01L 33/06* (2010.01)
*H10H 20/812* (2025.01)
(Continued)

(52) U.S. Cl.
CPC .......... *H10H 20/812* (2025.01); *H10H 20/82* (2025.01); *H10H 20/855* (2025.01)

(58) Field of Classification Search
CPC .... H10H 20/812; H10H 20/82; H10H 20/855; H10H 20/882; H10H 20/84; H10H 20/872
See application file for complete search history.

(56) References Cited

U.S. PATENT DOCUMENTS 5,777,433 A 7/1998 Lester et al.
6,717,362 B1 4/2004 Lee et al.
(Continued)

OTHER PUBLICATIONS

Carter, Catrice Monet. Device and metasurface designs for next-generation blue-emitting organic LEDs. Retrieved from https://doi.org/doi:10.7282/T33N26MW (Year: 2018).*
(Continued)

*Primary Examiner* — Jarrett J Stark
(74) *Attorney, Agent, or Firm* — Barnes & Thornburg

(57) ABSTRACT

Light extraction efficiency of existing semiconductor light emitting devices can be increased significantly by introducing a nanoparticle 'meta-grid' on top of a conventional light emitting diode (LED) chip, within its usual encapsulating packaging or casing. The 'meta-grid' is essentially a monolayer or a 2D array of sub-wavelength metallic nanoparticles (NPs) with sub-wavelength inter-particle separation. The local dielectric environment around the NPs and within the gaps between the NPs could be the same as the encapsulant, or any other optically transparent material with refractive index close to that of the encapsulant. Upon optical excitation, the collective oscillations of conduction electrons, or surface plasmon, of the metallic NPs give rise to localized surface plasmon resonances. When placed on top of the LED chip, which acts as a high refractive index substrate for the NPs, these NPs can couple strongly to the light emitted by the chip, acting as efficient resonant plasmonic antennae or scatterers for light. The plasmon-mediated light coupling can by optimized by tuning the composition, size, and shape of the NPs, their inter-particle gaps and their distance from the LED chip surface. By virtue of the localized-surface-plasmon-enhanced light transmission through the optimized NP 'meta-grid', the efficiency of extraction of the light generated by the semiconductor LED chip into its encapsulating casing can be significantly improved.

16 Claims, 10 Drawing Sheets
(7 of 10 Drawing Sheet(s) Filed in Color)

(51) Int. Cl.

| | |
|---|---|
| ***H10H 20/82*** | (2025.01) |
| ***H10H 20/855*** | (2025.01) |

(56) References Cited

U.S. PATENT DOCUMENTS

| | | | | |
|---|---|---|---|---|
| 6,870,311 | B2 | 3/2005 | Mueller et al. | |
| 7,358,543 | B2 | 4/2008 | Chua | |
| 7,791,093 | B2 | 9/2010 | Basin et al. | |
| 2002/0030194 | A1 | 3/2002 | Camras et al. | |
| 2006/0056021 | A1* | 3/2006 | Yeo | G02B 5/0242 359/460 |
| 2008/0210965 | A1 | 9/2008 | Hung | |
| 2016/0077261 | A1* | 3/2016 | Arbabi | G02B 5/3083 359/493.01 |
| 2016/0087143 | A1* | 3/2016 | Teo | H10H 20/82 438/47 |
| 2016/0261086 | A1* | 9/2016 | Pruneri | H01S 3/106 |
| 2018/0129866 | A1* | 5/2018 | Hicks | H04N 23/20 |
| 2018/0131160 | A1* | 5/2018 | Zhang | H01S 5/0622 |
| 2018/0172988 | A1* | 6/2018 | Ahmed | G06T 11/00 |
| 2018/0299607 | A1* | 10/2018 | Menezes | G02B 6/0065 |
| 2019/0041562 | A1* | 2/2019 | Ahmed | G02B 5/3025 |
| 2019/0064074 | A1* | 2/2019 | Ragan | G06N 20/00 |
| 2019/0196267 | A1* | 6/2019 | Yoo | B29D 11/00326 |
| 2020/0333617 | A1* | 10/2020 | Ahmed | G02B 27/48 |

OTHER PUBLICATIONS

Electrically Tunable Transparent Displays for Visible Light Based on Dielectric Metasurfaces, ACS Photonics 2019 6 (6), 1533-1540 DOI: 10.1021/acsphotonics.9b00301 (Year: 2019).*

Spatiotemporal light control with active metasurfaces, Science May 17, 2019 vol. 364, Issue 6441 DOI: 10.1126/science.aat3100 (Year: 2019).*

Li, J. & Zhang, G. Q. Light-Emitting Diodes. 4, (Springer International Publishing, 2019).

Schubert, E. F. Light-Emitting Diodes. in Wiley Encyclopedia of Electrical and Electronics Engineering 1-10 (John Wiley & Sons, Inc., 2014) doi:10.1002/047134608X.W3144.pub2.

Sikdar, D., & Kornyshev, A. A. (2016). Theory of tailorable optical response of two-dimensional arrays of plasmonic nanoparticles at dielectric interfaces. Scientific reports, 6(1), 1-16.

* cited by examiner

ENHANCED LIGHT EXTRACTION FROM LIGHT EMITTING DIODES UTILIZING A NANOPARTICLE META-GRID

CROSS REFERENCE TO RELATED APPLICATIONS

This application claims priority from U.S. Provisional Application No. 63/221,575, filed on Jul. 14, 2022, the entirety of which is hereby fully incorporated by reference herein.

This patent or application file contains at least one drawing executed in color. Copies of this patent or patent application publication with color drawing(s) will be provided by the Office upon request and payment of the necessary fee.

FIELD OF THE INVENTION

The present invention relates to light emitting diodes (LEDs) and, more particularly, to a technique for enhancing the light extraction efficiency of LEDs.

BACKGROUND TO THE INVENTION

Light emitting diodes (LEDs) are widely used in the modern world, including in traffic lights, backlighting of electronic displays, large outdoor screens, general lighting/decorations, sensing, and water purification/decontamination. There have been numerous research attempts over the years to further enhance the light extraction efficiency of LEDs, with a view to achieving greater light output.

The efficiency of light extraction from conventional light emitting devices—such as semiconductor light emitting diodes (LEDs), where a semiconductor LED chip (of refractive index $n_1$, from 2.4 to 3.6) is encapsulated by any known insulating material (of refractive index $n_2$, from 1.4 to 1.6)—is limited mainly by two inherent issues, as follows.

First, the chip-encapsulating material (e.g. epoxy, silicone resin, plastic, or glass) has a much lower refractive index ($n_2$) compared to the refractive index of the chip ($n_1$).

Therefore, the amount of light (emitted from a p-n junction in the LED chip) being extracted into the encapsulating casing gets curbed due to the restrictions imposed by the critical angle $\theta_c$ of the chip/encapsulant interface, where $\theta_c = \sin^{-1}(n_2/n_1)$. When light impinges on that interface at angle $\theta_c$, it escapes getting refracted along the interface. For angles larger than $\theta_c$, the incident light is total internally reflected and nothing escapes into the encapsulating casing. The larger the difference between the refractive indices of the two materials (LED chip and encapsulant), the greater is the critical angle loss and lesser is the light extraction efficiency.

Second, due to the difference between the two refractive indices (mentioned above), even at angles smaller than $\theta_c$ some fraction of the incident light is reflected back, accounting for the Fresnel loss. The larger the difference, the greater is the loss. Owing to this limitation, for a typical LED semiconductor material ($n_1$=3.5) and a typical encapsulant ($n_2$=1.6), a maximum of only ~84% of the light emitted by the LED chip can be extracted into the casing at normal incidence and less than that at larger angles of incidence.

Re-absorption of the reflected light inside the LED chip also leads to device heating, which in turn reduces the device lifetime. To mitigate these issues, the use of chalcogenide glasses with higher refractive indices than epoxy/plastic has previously been proposed [1, 2].

However these present significant difficulties as different equipment is needed in processing those glasses (which are even typically not so transparent) for mass production of LEDs. A proposal for creating LED chips of hemispherical shape has also been made, for reducing total internal reflection by causing the incident angle to always be less than $\theta_c$ with the curved chip surface, which could therefore minimize the critical angle loss [2]. However, hemispherical LED chips are bulky, and their fabrication is more difficult and economically less viable for mass production.

An earlier attempt [3] proposed increasing the effective refractive index of the packaging material to improve the light extraction efficiency. The idea was to populate the usual encapsulating material or host (with lower refractive index than the LED chip) by nanoparticles (of larger refractive index than the host, e.g., made of transparent metal oxides, or combination of metal oxides or of one of group II-VI materials or alloys of Zn, Se, S, Te or even GaN, SiN or AlN) of size ranging from ⅕ to 1/20 of the LED wavelength in such density to ensure higher refractive index than the host material without compromising on transparency. But the control of nanoparticle density, and their arrangement in the host without agglomeration while preserving transparency, as well as mitigating adverse effects from dispersion of sizes on LEDs of different emission wavelengths, are difficult targets to achieve.

Proposals [4] for bonding of a transparent high refractive index optical element (e.g., lens or optical concentrator) to a light emitting device were also made for improving the light extraction efficiency of the light emitting device by reducing loss due to total internal reflection, which can be achieved without deploying an encapsulant.

Another attempt [5] was made for improving the light extraction using a transparent casing of gradient refractive index to encapsulate the p-n junction diode. The transparent casing must have a high refractive index on the inner portion positioned close to the chip, with a gradually lowering refractive index towards the outer portion while getting away from the chip.

For achieving enhanced broadband emission from phosphor-converted light-emitting devices, proposals [6] were made for using a layer of substantially transparent packaging material with sub-wavelength nanoparticles (of relatively higher refractive index than the packing material) and super-wavelength particles of phosphors materials (with intermediate refractive index of packing material and sub-wavelength particles) dispersed in it.

In another attempt [7] to increase light extraction by reducing the total internal reflection loss, new LED packages were proposed having either homogeneous packing of intrinsically optically transparent nanoparticles of high refractive index or with additional transparent substance in the gaps among the nanoparticles. Proposals with nano $TiO_2$ composite light-extracting layer encapsulated by epoxy resin and nano ZrO composite light-extracting layer encapsulated by silicone rubber were presented.

A new proposal [8] mentioned methods of fabricating LEDs with a layer of photonic crystals on the light source and a region of diffusing material over the photonic layer. Another embodiment [9] showed that mixing sub-micron size granules of $TiO_2$, $ZrO_2$, or other white coloured non-phosphor inert granules with a silicone encapsulant can lead to an increase in LED light extraction by over 5%, when applied over an LED.

Most of the prior attempts focused on proposing new encapsulating materials of higher refractive index for improved light extraction, by reducing critical angle loss.

However, larger refractive index of the encapsulant can lead to more light getting reflected back from the encapsulant/air interface, adding to the Fresnel loss. Those proposals demand additional processes to be incorporated in the existing LED mass production process, making manufacturing complex and economically challenging for its quick adaption in the existing LED industry.

There is therefore a desire for an alternative way of enhancing the light extraction efficiency of LEDs while using conventional encapsulant materials.

SUMMARY OF THE INVENTION

The present invention deploys a monolayer of sub-wavelength plasmonic nanoparticles (NPs) acting as a 'meta-grid' to be positioned on top of a conventional LED chip, placed within the chip's usual encapsulating packaging. This significantly improves the light extraction efficiency by drastically reducing the Fresnel loss—by virtue of localized-surface-plasmon-enhanced light transmission through an optimized NP 'meta-grid'—resulting in an increase of the LED light extraction efficiency by ~15-18%. This also reduces internal heating of the LED chip, caused by reabsorption of the reflected light. Thus the invention confers an additional benefit of boosting the device lifetime, as well as increasing light extraction efficiency, by introducing one additional layer within the otherwise conventional LED design, which can easily be incorporated in existing LED manufacturing processes.

Unlike the previous attempts where mainly optically transparent nanoparticles with high refractive index were deployed for enhancing light extraction efficiency, the present invention proposes the use of metallic nanoparticles with a strong surface plasmon resonance effect.

According to a first aspect of the present invention there is provided a light emitting diode (LED) device comprising: an LED chip having a light-emitting p-n junction therein, for emitting light with peak intensity at a given wavelength; and an encapsulating casing adjacent to the LED chip; wherein the LED device further comprises a two-dimensional array of sub-wavelength metallic nanoparticles on top of the LED chip, within the casing, wherein the metallic nanoparticles are less than said wavelength in diameter and have an inter-particle separation that is less than said wavelength; wherein the metallic nanoparticles are arranged to couple to light emitted from the LED chip in use, and to act as resonant plasmonic antennae or scatterers for the emitted light. The wavelength of the emitted light may be within the visible spectrum or outside the visible spectrum (e.g. infrared or ultraviolet). Destructive interference between light reflected from the chip/encapsulant interface and light reflected by the nanoparticle array provides enhanced transmission of light from the LED chip through the casing, and less reabsorption of the reflected light. This results in reduced heating of the LED chip due to such reabsorption, which in turn is expected to extend the lifetime of the chip.

For example, by incorporating a nanoparticle array in accordance with the present invention, transmission across a typical LED-chip/encapsulant interface at the wavelength of peak emission can be boosted up to ~99%. Without the nanoparticle array the transmission may otherwise be a mere ~84% at normal incidence. Accordingly, an increase of the LED light extraction efficiency of ~15% may be achieved. Viewed another way, by incorporating a nanoparticle array the amount of reabsorbed (lost) light can be reduced from ~16% (=100%-84%) down to ~1% (=100%-99%), giving a ~16× reduction in the light-induced-heating of the LED chip, and potentially a commensurate increase in the lifetime of the chip.

In certain embodiments the metallic nanoparticles comprise silver. However, in other embodiments, alternative plasmonic materials, such as gold, aluminium or copper, may be used instead.

The metallic nanoparticles may have a radius in the range of 5 nm to 50 nm. Optionally the radius may be in the range of 5 nm to 40 nm, for example in the range of 10 nm to 20 nm.

Adjacent metallic nanoparticles may be spaced by an inter-particle gap, wherein the inter-particle gap is in the range of 2 nm to 150 nm. Optionally the inter-particle gap may be in the range of 5 nm to 80 nm, for example in the range of 10 nm to 40 nm The array of metallic nanoparticles may be disposed at a height above a surface of the LED chip, within the casing, wherein the height is in the range of 0 nm to 500 nm. Optionally the height may be in the range of 5 nm to 50 nm, for example in the range of 20 nm to 40 nm.

In some embodiments the metallic nanoparticles in the array may each be coated or functionalized with ligands to cause the nanoparticles to adopt a desired inter-particle gap spacing when the array is formed.

A dielectric material may be disposed around and between the nanoparticles. Optionally, but advantageously, for ease of manufacture, the dielectric material may be the same as the material from which the casing is formed.

To facilitate fabrication, in other embodiments the metallic nanoparticles in the array may each be coated with a dielectric shell (e.g. of silica), thereby forming an array of coated nanoparticles, each coated nanoparticle comprising a core nanoparticle with a respective shell layer. The coated nanoparticles may be close-packed in the array.

The core nanoparticles may have a radius in the range of 5 nm to 30 nm, depending on their spacing. Optionally the radius may be in the range of 5 nm to 25 nm, for example in the range of 10 nm to 20 nm.

The shell layer may have a thickness in the range of 1 nm to 30 nm. Optionally the thickness may be in the range of 2 nm to 25 nm, for example in the range of 4 nm to 15 nm.

The array of coated nanoparticles may be disposed at a height above a surface of the LED chip, within the casing, wherein the height is in the range of 0 nm to 500 nm. Optionally the height may be in the range of 5 nm to 50 nm, for example in the range of 20 nm to 40 nm.

According to a second aspect of the present invention there is provided a method of manufacturing a light emitting diode (LED) device, the method comprising: forming an encapsulating casing adjacent to an LED chip, the LED chip having a light-emitting p-n junction therein, for emitting light with peak intensity at a given wavelength; wherein forming the encapsulating casing includes forming a two-dimensional array of sub-wavelength metallic nanoparticles on top of the LED chip, within the casing, wherein the metallic nanoparticles are less than said wavelength in diameter and have an inter-particle separation that is less than said wavelength; wherein the metallic nanoparticles are arranged to couple to light emitted from the LED chip in use, and to act as resonant plasmonic antennae or scatterers for the emitted light.

In certain embodiments the metallic nanoparticles comprise silver. However, in other embodiments, alternative plasmonic materials, such as gold, aluminium or copper, may be used instead, depending on the emission spectrum of the LED.

The metallic nanoparticles may have a radius R, adjacent metallic nanoparticles may be spaced by an inter-particle gap g, and the array of metallic nanoparticles may disposed at a height h above a surface of the LED chip, within the casing. The method may further comprise a preparatory process of optimising the values of R, g and h to optimise the transmittance of emitted light of a given wavelength from the LED chip.

In some embodiments the metallic nanoparticles in the array may each be coated or functionalized with ligands to cause the nanoparticles to adopt a desired inter-particle gap spacing when the array is formed.

In certain embodiments the array of nanoparticles may be formed using a drying-mediated self-assembly method on a substrate, wherein the substrate is then attached to a surface of the LED chip before the rest of the casing is applied, the thickness of the substrate determining the height of the array above the surface of the LED chip. In practice, the material of the substrate may be chosen to have a refractive index as close as possible to that of the LED casing material. Optionally the substrate may be stretchable, to enable adjustment/tuning of the spacing of the nanoparticles by stretching the substrate before the rest of the casing is applied. In other embodiments other techniques for depositing the nanoparticles may be used, such as printing methods.

In other embodiments the metallic nanoparticles in the array may each be coated with a dielectric shell (e.g. of silica), thereby forming an array of coated nanoparticles, each coated nanoparticle comprising a core nanoparticle with a respective shell layer. Optionally the coated nanoparticles may be close-packed in the array.

In such a case, the core nanoparticles may have a radius r, the shell layer may have a coating thickness t, and the array of coated nanoparticles may be disposed at a height h above a surface of the LED chip, within the casing. The method may further comprise a preparatory process of optimising the values of r, t and h to optimise the transmittance of emitted light of a given wavelength from the LED chip.

The array of coated nanoparticles may be formed by spin coating on top of the LED chip. Optionally, controlled deposition of dielectric material, before the spin coating of the array of coated nanoparticles, may be used to determine the height of the array above the surface of the LED chip.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the invention will now be described, by way of example only, and with reference to the drawings in which:

FIG. 1(*b*) is a side-view and FIG. 1(*c*) is a 3 D view of an embodiment of a highly-efficient light emitting device after introducing a 2 D array, or 'meta-grid', of nanoparticles (NPs) within the epoxy material, at a height h from the LED chip surface (also not to scale). FIG. 1(*d*) is a four-layer-stack theoretical model for analysing optical transmission through the proposed system of FIGS. 1(*b*) and 1(*c*), where the NP array is represented by an equivalent continuous film of thickness d.

In the figures, like elements are indicated by like reference numerals throughout.

DETAILED DESCRIPTION OF PREFERRED EMBODIMENTS

The present embodiments represent the best ways known to the Applicant of putting the invention into practice. However, they are not the only ways in which this can be achieved.

The present work proposes the use of metallic nanoparticles (NPs) with a strong surface plasmon resonance effect. The plasmon-mediated light coupling allows enhanced light transmission through an optimized NP 'meta-grid' when placed at a definite height above the semiconductor LED chip, thus enabling a significant improvement in the light extraction efficiency of the LEDs.

Figure 1:
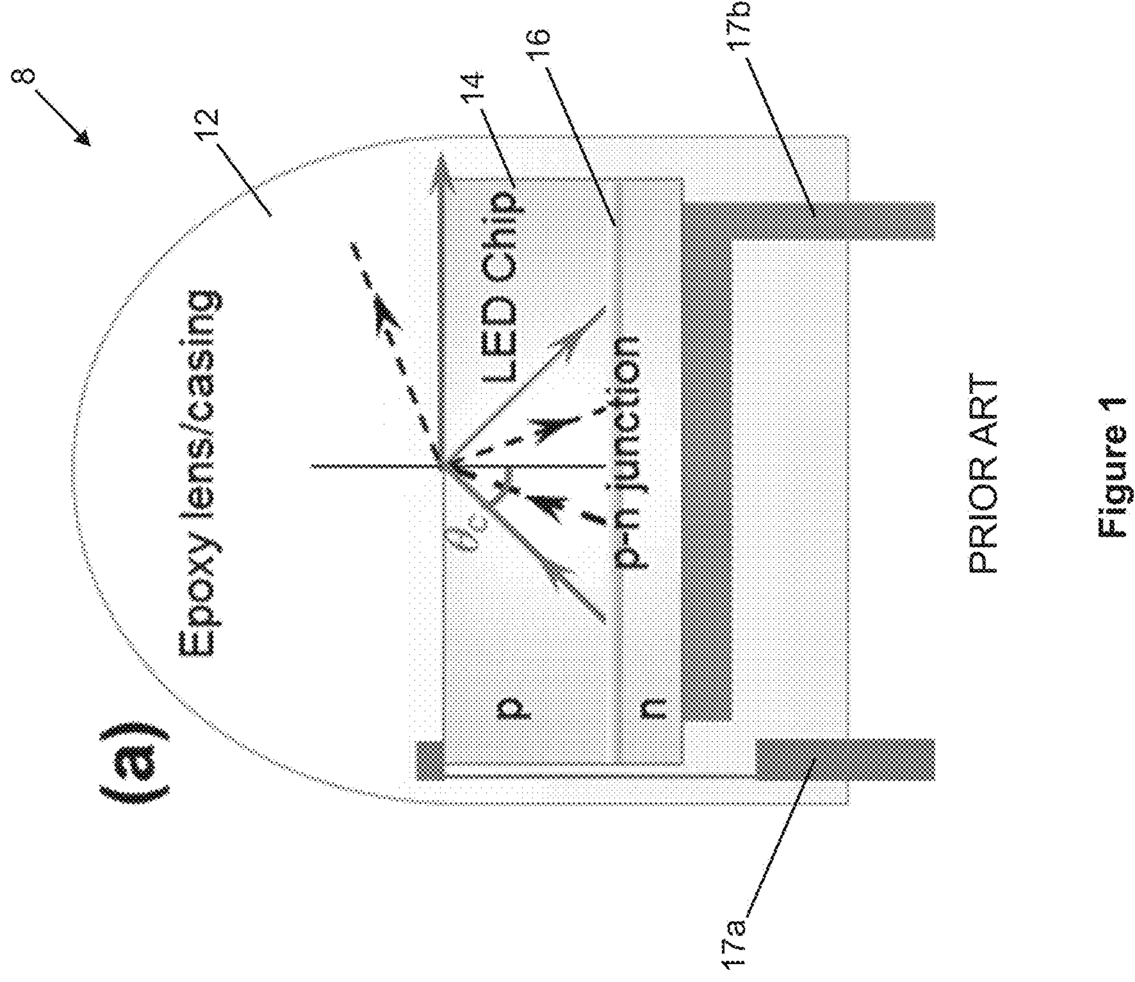
FIG. 1(*a*) is a schematic cross-sectional view (not to scale) of a typical prior-art light emitting device (including its electrical contacts), where an epoxy lens/casing encapsulates a semiconductor light emitting diode (LED) chip, and light emitted from the p-n junction can escape into the epoxy lens as long as the incident angle is less than the critical angle $\theta_c$.
Figure 1:
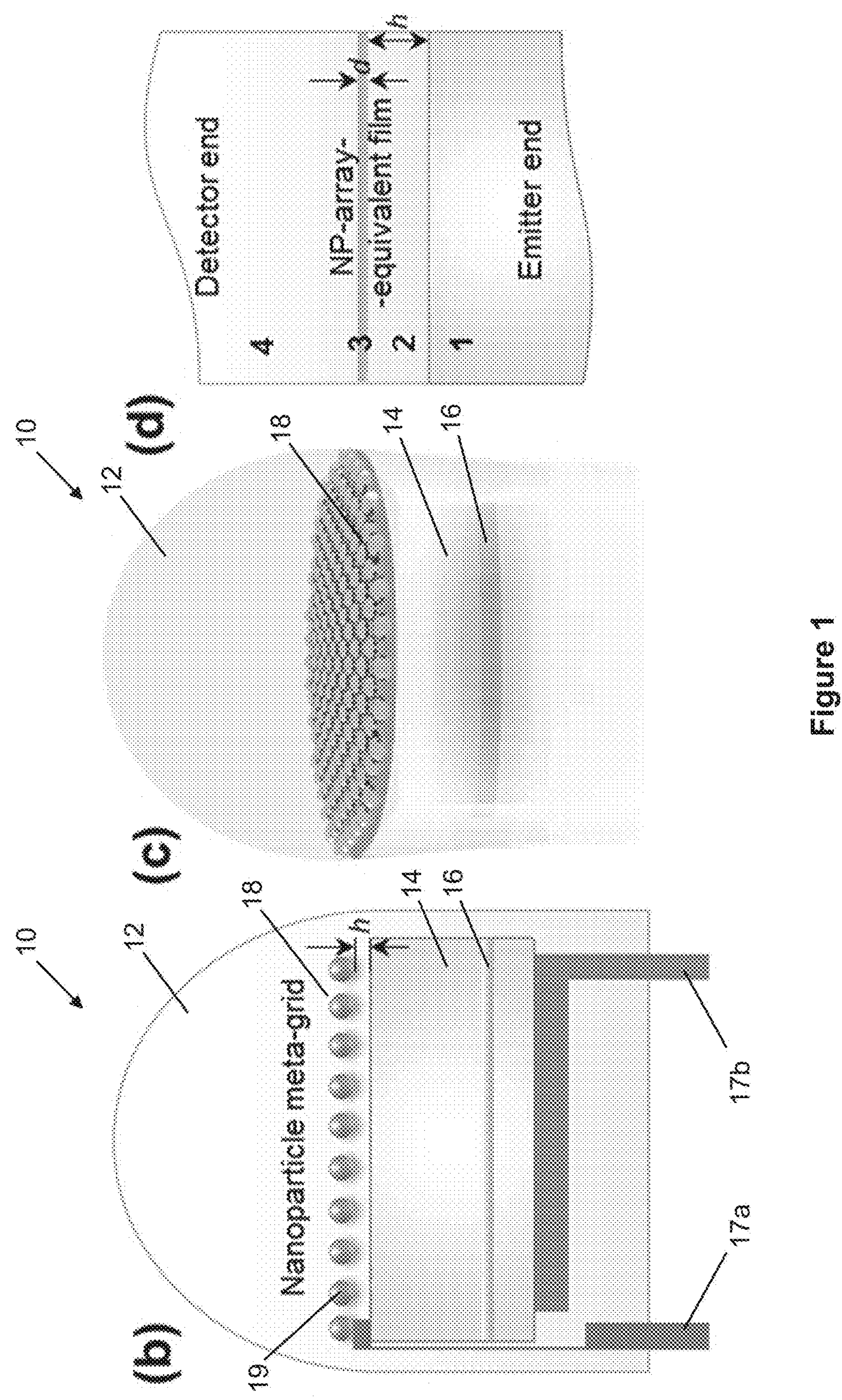

FIG. 1(*a*) depicts the cross-sectional view of a typical prior-art light emitting device 8, where a lens/casing 12 of an insulating packaging material (e.g. epoxy, plastic, or glass) encapsulates a semiconductor LED chip 14 having a p-n junction 16 therein. Although the casing 12 may be referred to herein as being made of epoxy, it will be appreciated that other materials, such as plastic or glass, may be used instead. Electrodes 17*a* and 17*b* are arranged to enable a current to flow across the p-n junction 16, to cause light to be emitted from the p-n junction 16. Light emitted from the p-n junction 16 in the LED chip 14 can escape into the epoxy casing 12 as long as the incident angle at semiconductor/epoxy interface is less than the critical angle $\theta_c$. At incident angles larger than $\theta_c$, light undergoes total internal reflection (not shown) at the interface, and hence cannot be extracted. At incident angle of $\theta_c$, light is transmitted (refracted) along the interface, with some reflection (shown using red arrows). Nevertheless, at incident angles smaller than $\theta_c$, light mostly escapes into the epoxy casing 12 with little amount of reflection (shown using dashed arrows).

Reducing the amount of reflection can also increase the lifetime of the LED chip 14 by eliminating heating-up of the chip that occurs due to reabsorption of the reflected light. Therefore, enhancing the efficiency of light extraction from the LED chip 14 into the epoxy casing 12 not only increases LED light output but also increases the lifetime of the device.

With reference now to FIGS. 1(*b*) and 1(*c*), embodiments of the present invention provide an LED device 10 that—in comparison to device 8 of FIG. 1(*a*)—deploys a layer or two-dimensional array 18 of sub-wavelength metallic nanoparticles (NPs) 19 that acts as a 'meta-grid' on top of the conventional LED chip 14, at a height h above the chip 14, embedded within the chip's encapsulating packaging/casing 12. (Apart from the presence of the NPs 19, the encapsulating packaging/casing 12 is otherwise conventional.) The local dielectric material on and around the NPs 19 and in the gaps between the NPs 19 may be any optically transparent material with a refractive index similar or close to that of the encapsulant of casing 12.

Upon optical excitation, the collective oscillations of conduction electrons of the metallic NPs 19 give rise to localized surface plasmon resonances. When placed near a high-index substrate, these NPs can couple strongly to the light coming from the substrate (here, the LED chip 14), acting as efficient resonant plasmonic antennae or scatterers for light. The size, shape, and composition of the NPs 19, inter-particle gap g, and height h from the LED chip 14 play significant roles in defining the surface plasmon resonance wavelength, which should ideally match the emission wavelength (of peak intensity) of the LED chip 14. The constructive interference between the light incident at the LED chip/encapsulant interface and the forward scattered light by the nanoparticle (NP) array 18 is the mechanism behind the enhanced transmission around the wavelength of surface plasmon resonance. The strength of plasmonic coupling between the NPs affects the spectral position and broadening of the plasmon resonance.

Thus, in summary, the present embodiments provide an LED device 10 comprising: an LED chip 14 having a light-emitting p-n junction 16 therein, for emitting light with peak intensity at a given wavelength; and an encapsulating casing 12 adjacent to the LED chip 14; wherein the LED device 10 further comprises a two-dimensional array 18 of metallic NPs 19 on top of the LED chip 14, within the casing 12, wherein the metallic NPs 19 are less than said wavelength in diameter and have an inter-particle separation that is less than said wavelength; wherein the metallic NPs 19 are arranged to couple to light emitted from the LED chip 14 in use, and to act as resonant plasmonic antennae or scatterers for the emitted light.

Modelling and Optimisation Studies

FIG. 1(*d*) depicts a four-layer-stack theoretical model for analysing optical transmission through the proposed device 10, that we have used in the optimisation studies below. In FIG. 1(*d*), 1 represents the LED chip surface 14, and 2 represents the encapsulating packaging/casing 12 between the LED chip surface 14 and the NP array 18. The NP array 18 is represented by an equivalent film 3 of thickness d placed at a height h from the LED chip surface 1. 4 represents the encapsulating packaging/casing 12 on top of the NP array 18.

Figure 2:
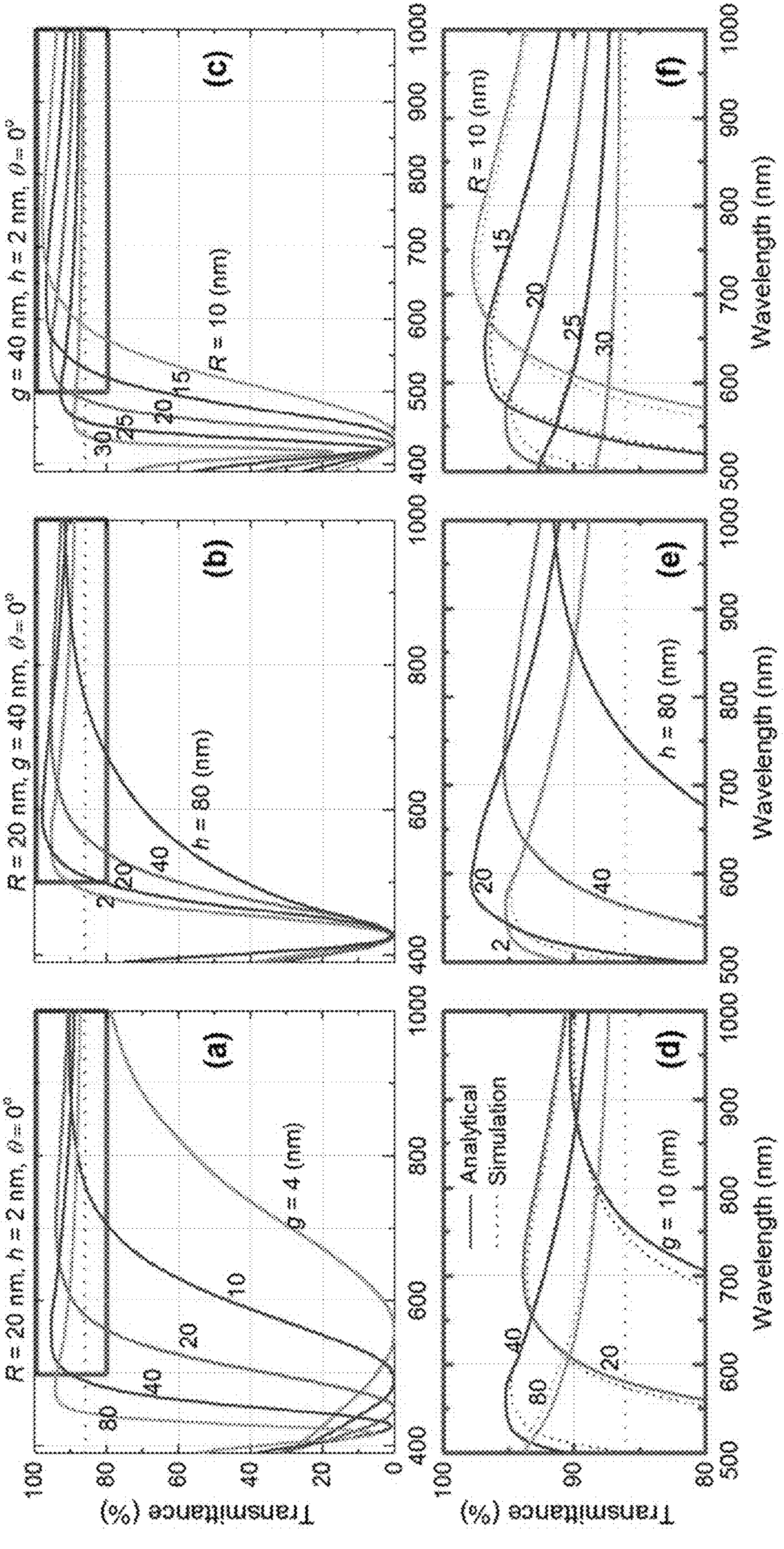
FIG. 2 shows transmittance spectra depicting the effects of different physical parameters of the hexagonal array of silver nanospheres, such as radius R, inter-particle gap g, assembled at a height h from the interface between a typical semiconductor material (n=3.5) and a typical encapsulating material (n=1.6). (a) Variation in g for fixed radius (R=20 nm) and height (h=2 nm). (b) Variation in h for fixed radius (R=20 nm) and gap (g=40 nm). (c) Variation in R for fixed gap (g=40 nm) and height (h=2 nm). (d-f) Enlarged view of the analytical spectra highlighted by the red boxes in (a-c) and comparing those with data (coloured dotted curves) obtained from full-wave simulations in each case. For all cases, only normally incident light is considered. Dotted horizontal lines indicate transmittance without the nanoparticle layer.

According to the present work, light extraction from the LED chip 14 is enhanced with the help of the NP array or 'meta-grid' 18. Therefore, the transmission of the light generated by the LED chip 14 into the epoxy casing 12 depends strongly on the structural properties of the NP 'meta-grid' 18. The roles of inter-particle gap g, height h, and radius R (R=d/2) in a 2 D hexagonal array of silver nanospheres are evaluated based on our original published theory [10], earlier tested by several experimental investigations of effects based on similar structures of plasmonic nanoparticle arrays. This analytical theory combines effective medium theory with a multi-layer Fresnel reflection scheme, and the results are depicted in FIGS. 2(*a*), 2(*b*), and 2(*c*) respectively, for normal incidence. The dotted horizontal lines in all cases show the transmittance in the absence of the nanoparticle layer 18. It can be seen that for different wavelength windows a different set of parameters of the nanoparticle array 18 provides enhanced transmission around the surface plasmon resonance wavelength. Besides silver, the present principles also support the use of any alternative plasmonic material, such as gold, aluminium, copper etc.

However, at wavelengths below the resonance wavelength, transmission is seen to reduce drastically due to a Fano effect, caused from a destructive interference between the scattered and incident light. Therefore, based on the spectral window of LED emission, the design of the nanoparticle 'meta-grid' 18 should be optimized. FIGS. 2(*d-f*) show the transmittance spectra highlighted in red boxes in FIGS. 2(*a-c*), respectively, along with the coloured dotted curves obtained from full-wave simulations for all cases considered in this study. This evidences the fact that the analytical approach taken is very accurate and hence, deployed for finding the optimal design of the meta-grid for a specific LED application.

Figure 3:
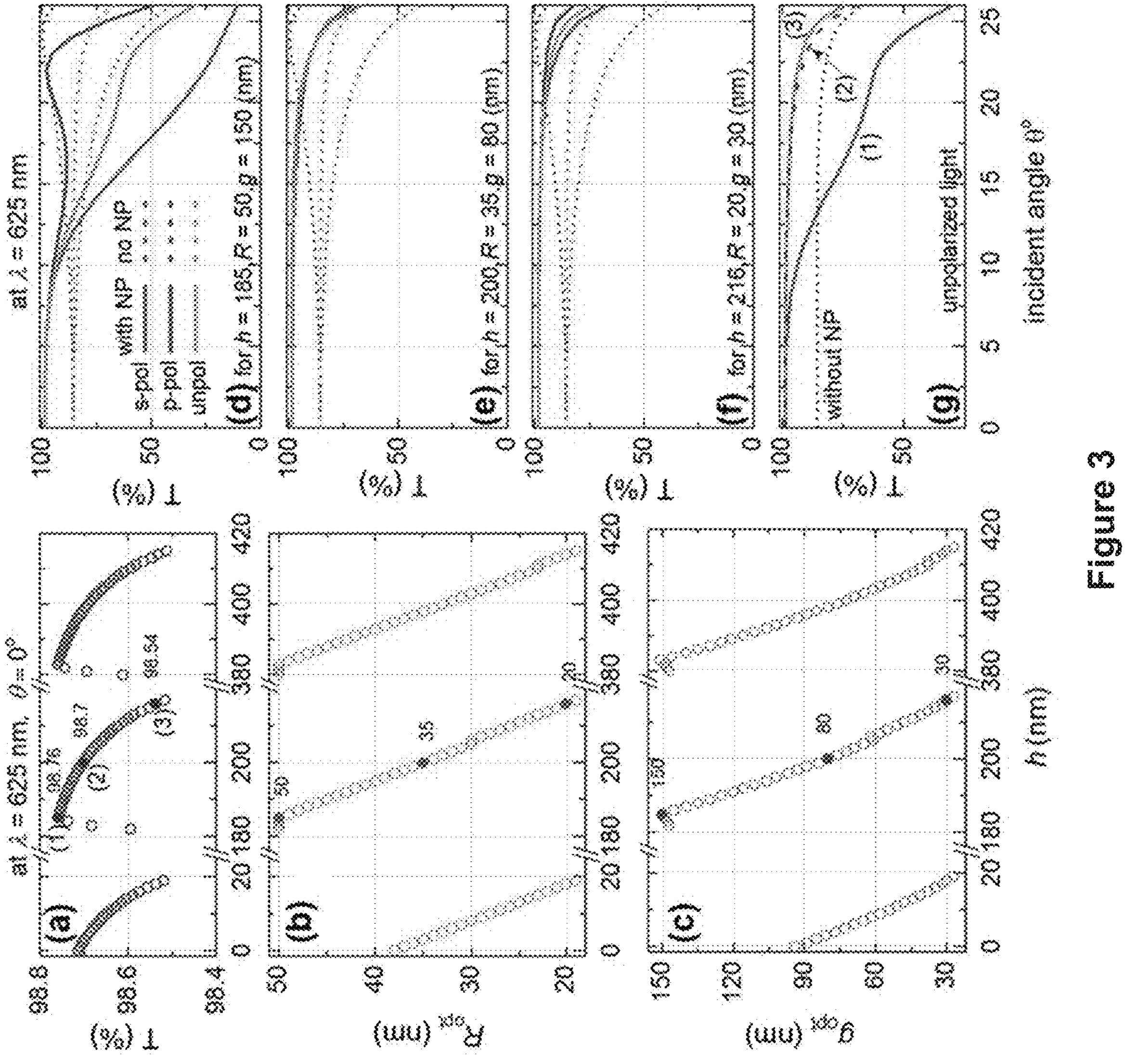
FIG. 3 shows (a-c) optimization of transmission at 625 nm for normal incidence via tuning of NP array parameters. (a) Maximum transmittance obtained at each of those heights h where T>98.5%, corresponding optimal (b) radius $R_{opt}$ and (c) inter-particle gap $g_{opt}$. (d-f) Transmission at different permissible incident angles for s-polarized (red), p-polarized (blue), and unpolarized (green) light for cases (1)-(3) (marked in (a)), respectively. The dotted curves are obtained for each polarization cases without the NP array. (g) Comparison among the transmittance for unpolarised light in the three cases, where the dotted line obtained without NP array serves as reference. Here, AlGaInP ($n_1$=3.49) is the semiconductor material and epoxy ($n_2$=1.58) is the encapsulating material.

A specific case of a typical red LED with peak emission wavelength at 625 nm is considered, where AlGaInP ($n_1$=3.49) is the semiconductor material (of chip 14) and epoxy ($n_2$=1.58) is the encapsulating material (of casing 12). The study assumes the following range of parameters: h from 0 nm to 500 nm, R from 5 nm to 50 nm, and g from 1 nm to 250 nm, all in steps of 1 nm. FIGS. 3(*a-c*) depict the transmittance (7) optimized at each height h (provided T>98.5%) at normal incidence. For all those cases, optimal transmittance, corresponding optimal radius $r_{opt}$ and optimal gap $g_{opt}$ are plotted in FIGS. 3(*a*), 3(*b*), and 3(*c*), respectively. Note that the transmission level obtained at any h repeats for other heights which are h+m*λ/(4*$n_2$), with X being the wavelength and m being an positive integer. This evidences a Fabry-Perot cavity like effect, with a narrow cavity formed between the LED/encapsulant interface and the NP meta-grid 18, behind the enhancement of transmission—where light incident on the LED/epoxy interface contructively interferes with light forward-scattered by the NP array 18.

FIG. 3(*a*) labels three distinct points as (1), (2), and (3), for which $r_{opt}$ and $g_{opt}$ are marked as filled circles with values listed in FIGS. 3(*b*) and 3(*c*), respectively. These cases are further investigated for all permissible incident angles below the critical angle. FIGS. 3(*d-f*) depict the transmittance for s-polarized (red), p-polarized (blue), and unpolarized (green) light for cases (1)-(3), respectively, at different incident angles with/without the nanoparticle array 18. Case (1), though providing the maximum T at normal incidence, is strongly polarization sensitive at off-normal incidence angles as large NPs are involved (FIG. 3(*d*)). It can be seen that cases (2) and (3) are almost polarization-insensitive for all permissible angles (FIG. 3(*e,f*)). For unpolarized light, which is the case with light emitted from an LED chip 14, case (3) shows the largest transmittance over all permissible angles with the best angle-averaged transmittance. Comparison among the three cases shows that small NPs may exhibit better angle-averaged transmittance for unpolarized light (FIG. 3(*g*)). Therefore, the optimization study should consider transmittance to be averaged over all allowed angles, not just for a normal incidence case.

Another important aspect is to consider the fact that the typical emission spectrum of any commercial LED (of any colour) has a finite spectral width. For example, the entire emission spectrum of AlGaInP/GaAs red LEDs by Toyoda Gosei Corp. ranges from 580-700 nm. Therefore, we conducted the next optimization study for the above spectral range and maximize transmittance over all permissible angles. The range can be customized according to the specific emission spectrum of an existing LED chip 14 on top of which nanoparticle 'meta-grid' 18 will be inserted.

Figure 4:
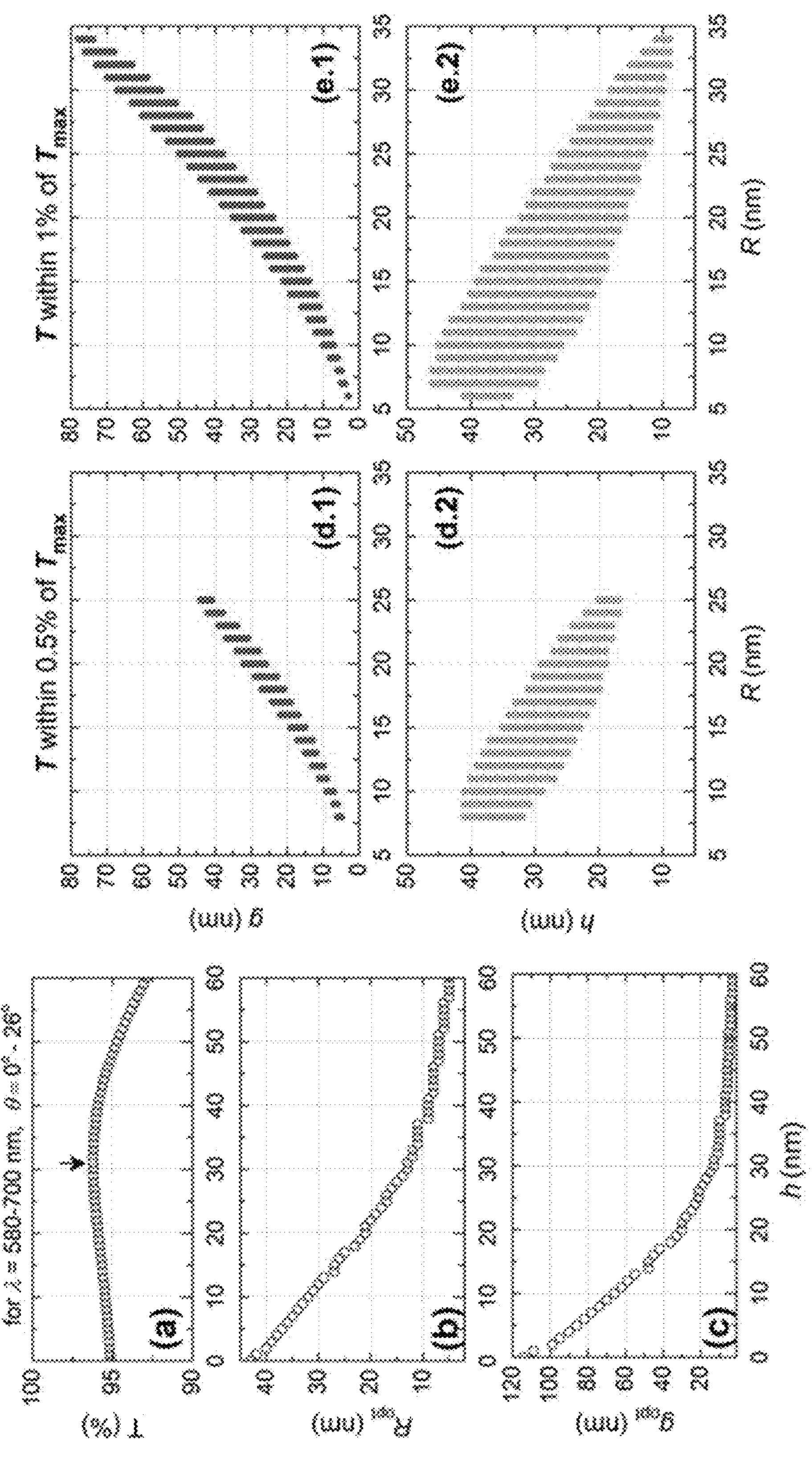
FIG. 4 shows (a-c) Optimal transmission and corresponding nanoparticle array parameters at different heights from the LED chip surface. The maximal transmittance (a), corresponding optimal radius (b) and optimal gap (c) at different heights. Yellow dots represent the optimum point of the maximum transmission ($T_{max}$=96.2%) at ($h_{opt}$=33 nm, $R_{opt}$=13 nm, $g_{opt}$=13 nm). (d) Different other specifications of nanoparticle array parameters, such as inter-particle gap and height for a given nanoparticle radius that allow transmission within 0.5% (d) and within 1% (e) of $T_{max}$. Note that, for calculations the spectral window between 580 and 700 nm was considered in step of 1 nm and angles between 0° and 26° were taken in step of 1°. Beyond the critical angle)(~26° light emitted from LED chip gets total internally reflected and fails to escape into epoxy lens. Here, AlGaInP (n=3.49) is the semiconductor material and epoxy (n=1.58) is the encapsulating material.

FIGS. 4(*a-c*) depict the optimal transmittance and corresponding nanoparticle array parameters at different heights (a range from 0 to 60 nm is shown here, beyond which transmittance gradually decreases and hence, not is a region of interest). The transmittance described here is calculated over a spectral range of 580-700 nm and averaged over incident angles ranging between 0° and 26°. The yellow dots represent the optimum point of the maximum transmittance ($T_{max}$=96.2%) at $h_{opt}$=33 nm, $R_{opt}$=13 nm, $g_{opt}$=13 nm. The study reveals a trend where both optimal radius and inter-particle gap shrink with height. It is also useful to know what other combinations of nanoparticle array parameters can provide transmission within 0.5% and 1% of Tmax. The inter-particle gap g and height h for a given nanoparticle radius R for these two cases are shown in FIGS. 4(*d*) and 4(*e*), respectively.

Figure 5:
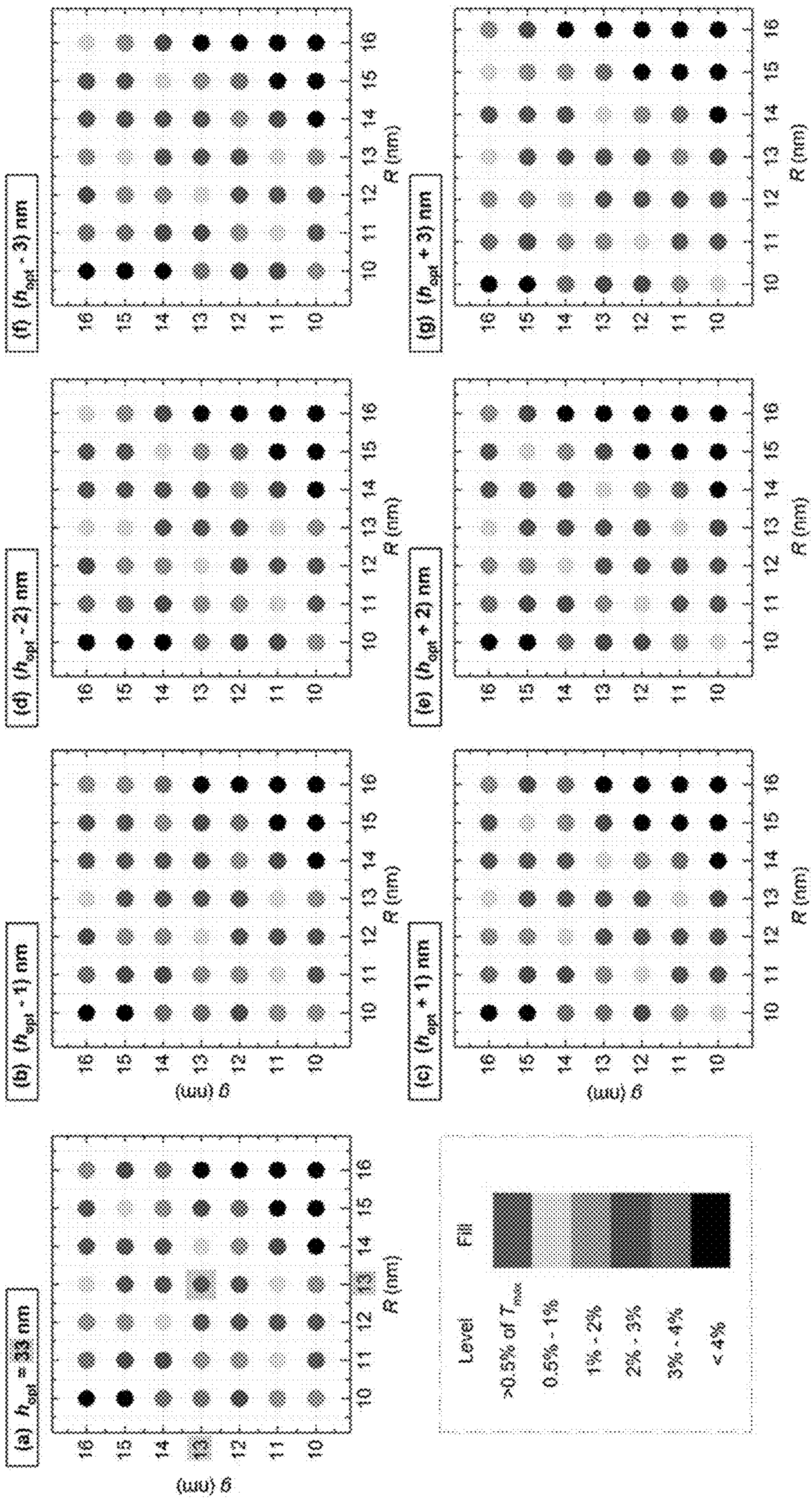
FIG. 5 shows optimization of transmittance (over a spectral window of 580-700 nm averaged over all permitted incident angles (below the critical angle) and its sensitivity to the NP meta-grid parameters. (a) Dots with different fill colours depicting deviation from the maximum transmittance ($T_{max}$) at fixed height of $h_{opt}$=33 nm but for changes in radius R and gap g, where both these parameters are assumed to be larger/smaller by up to 3 nm from their optimal values. $T_{max}$ (of 96.2%) is achieved at optimal height $h_{opt}$=33 nm, for optimal radius of 13 nm and gap of 13 nm (highlighted in cyan). (b-g) Same as in (a), but at different heights of ($h_{opt}$−1), ($h_{opt}$+1), ($h_{opt}$−2), ($h_{opt}$+2), ($h_{opt}$−3), ($h_{opt}$+3), respectively. Note that, for calculations the spectral window between 580 and 700 nm was considered in step of 1 nm and angles between 0° and 26° were taken in step of 1°. Beyond the critical angle) (~26° light emitted from LED chip gets total internally reflected and fails to escape into epoxy lens. Here, AlGaInP (n=3.49) is the semiconductor material and epoxy (n=1.58) is the encapsulating material.

It is also useful to see how sensitive the maximum transmittance level is to the deviations from optimal radius and optimal gap, as could be the case in experiments. FIG. 5(*a*) plots the transmittance levels achieved for all combinations of $R_{opt}$+/−3 nm and $g_{opt}$+/−3 nm at optimal height $h_{opt}$=33 nm. Notice that, the figure is indeed a 2 D map of transmittance levels in R-g plane with ($R_{opt}$, $g_{opt}$) at the centre (highlighted in cyan), for fixed height of $h_{opt}$—where the dots, filled with different colours, represent different percentage deviation from $T_{max}$ Similar 2 D maps of transmittance are also plotted plane for different h values ranging from $h_{opt}$−3 nm to $h_{opt}$+3 nm (see FIGS. 5(*b-g*)).

In practice, for any given wavelength of LED, following the above approach (which may be considered to be a preparatory process prior to manufacture) an optimum set of parameters for the nanoparticle array 18 may be found, in respect of:

The radius R of the nanoparticles 19—typically in the range of 5 nm to 50 nm, with optimum values $R_{opt}$ typically in the range of 5 nm to 40 nm, particularly in the range of 10 nm to 20 nm.

The inter-particle gap g—typically in the range of 2 nm to 150 nm, with optimum values $g_{opt}$ typically in the range of 5 nm to 80 nm, particularly in the range of 10 nm to 40 nm. In practice, the inter-particle gap g may be an average value across the array 18, as a degree of variation in the inter-particle gap distance is possible from particle to particle.

The height h of the nanoparticle array 18 from the surface of the LED chip 14—typically in the range of 0 nm to 500 nm, with optimum values $h_{opt}$ typically in the range of 5 nm to 50 nm, particularly in the range of 20 nm to 40 nm.

Use of Coated or Functionalized Nanoparticles

To create the desired inter-particle gap $g_{opt}$, each nanoparticle 19 in the array 18 may be coated or functionalized with sufficiently long ligands such that the nanoparticles 19 naturally adopt the desired inter-particle gap spacing $g_{opt}$ when the array 18 is fabricated.

To this end, having determined the optimal configuration of the nanoparticle array 18, for example as outlined above, the next step is to prepare nanospheres 19 (e.g. of silver) of radius $R_{opt}$, coated/functionalized with sufficiently long ligands to ensure the desired inter-particle gap of $g_{opt}$ is obtained. A monolayer array 18 of these nanoparticles 19 can be fabricated using a drying-mediated self-assembly method, as done for 'plasmene' prepared on epoxy or any other transparent substrate (of similar refractive index to the encapsulant material), where the substrate thickness is chosen to correspond to $h_{opt}$. The dielectric environment around the nanoparticles 19 and in the gaps between the nanoparticles 19 can be same as that of the epoxy substrate, or any other transparent material with similar refractive index to that of the encapsulant material may be used. Such nanoparticle meta-grid formed on the epoxy substrate (or on a stretchable substrate would allow for precise tuning of the size of the inter-particle gap) can then be stamped on to the LED chip 14, and after that the usual epoxy casing 12 can be fabricated or inserted.

Use of Metallic-Core/Dielectric-Shell Nanoparticles

Figure 6:
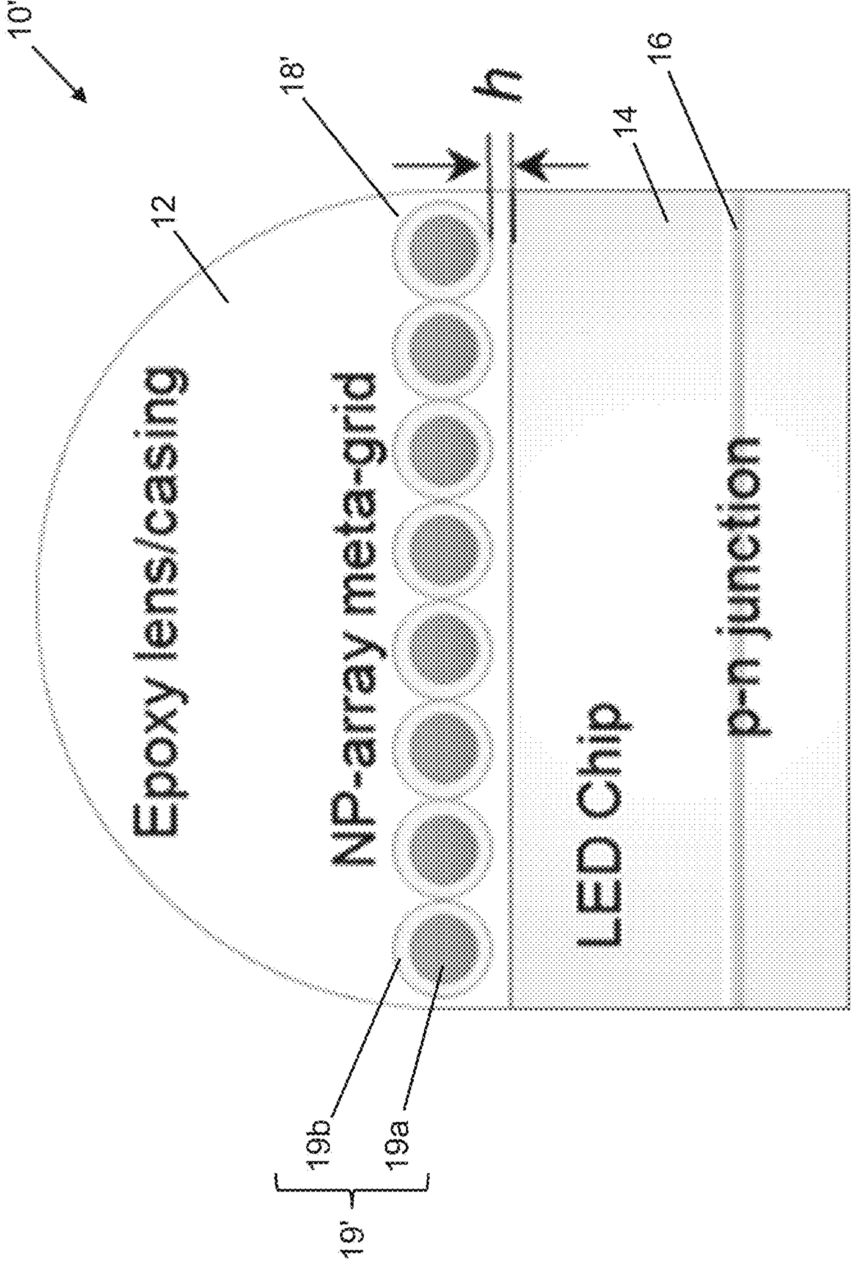
FIG. 6 shows a side-view of an embodiment of a highly-efficient light emitting device after introducing a 2 D array of touching (hexagonal close-packed) core/shell nanoparticles embedded in the epoxy material at a height h from the LED chip surface.

In another embodiment, in order to make the fabrication of a nanoparticle 'meta-grid' even easier, the use of metallic-core/dielectric-shell nanoparticles is proposed, which can form a hexagonal close-packed (inter-particle gap g=0) array upon spin coating on top of the LED chip 14. A controlled deposition of epoxy layer before the spin coating process would allow for the height $h_{opt}$ needed for the 'meta-grid' to perform optimally. The dielectric environment around the nanoparticles and in the gaps between the nanoparticles can be the same as that of the epoxy substrate, or any other transparent material with similar refractive index of that of the encapsulant material may be used. FIG. 6 depicts a cross-sectional view of a proposed embodiment of an LED device 10' with a nanoparticle layer 18' of touching silica-coated silver nanospheres 19' on top of the LED chip 14. More particularly, in the nanoparticle layer 18', each nanoparticle 19' comprises a metallic core nanosphere 19*a* (e.g. silver) and a dielectric shell layer 19*b* (e.g. silica).

Figure 7:
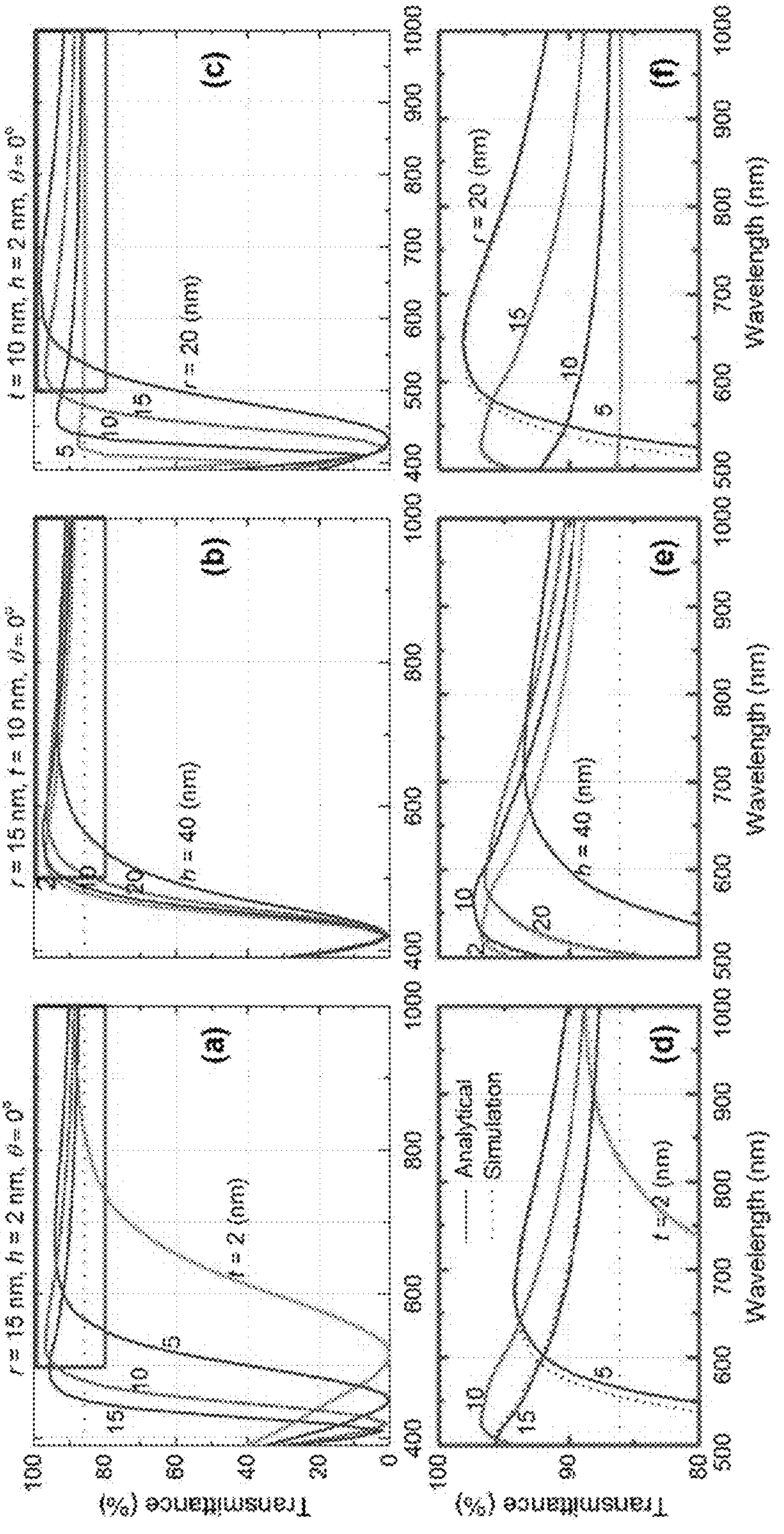
FIG. 7 shows the same as FIG. 2 but for close-packed hexagonal array of silica coated silver NPs, with core radius r and shell thickness t. (a) Variation in t for fixed core radius (r=15 nm) and height (h=2 nm). (b) Variation in h for fixed core radius (r=15 nm) and shell thickness (t=10 nm). (c) Variation in r for fixed shell thickness (t=10 nm) and height (h=2 nm). (d-f) Enlarged view of the part of the analytical spectra highlighted by the red box in (a-c) and comparing those with data obtained from full-wave simulations in each case. For all cases, only normally incident light is considered.

It will be appreciated that the shell layer 19*b* of each nanoparticle 19' causes the core nanospheres 19*a* to be spaced apart from one another in the nanoparticle layer 18'. The effect of the shell layer 19*b*, which has a thickness t, is therefore similar to the effect of the inter-particle gap spacing g described above, in spacing apart the metallic core nanospheres 19*a*. In this case, though, the transmittance of the structure will depend strongly on the radius r of the core nanosphere 19*a*, the thickness t of the shell layer 19*b*, and the height h. FIGS. 7(*a-c*) depict the changes in transmittance with different t (for fixed r and h), different h (for fixed r and t), and different r (for fixed r and t), respectively. It is seen that different nanoparticle arrays 18' provide enhanced transmission over different wavelength windows. For reference, transmittance levels without the nanoparticle layer 18' are shown using dotted horizontal lines in all cases.

Here again, it is evident that for different LEDs with different emission spectral windows, the configuration of the nanoparticle array 18' should be optimized. The transmission spectra highlighted in red boxes in FIGS. 7(*a-c*), respectively, are plotted in FIGS. 7(*d-f*) along with their counterparts obtained from full-wave simulations. The close correspondence between the two data sets confirms that our analytical approach can be very well used for core/shell nanoparticle arrays 18', for finding the optimal design of the core/shell nanoparticle meta-grid 18' for any LED application.

Figure 8:
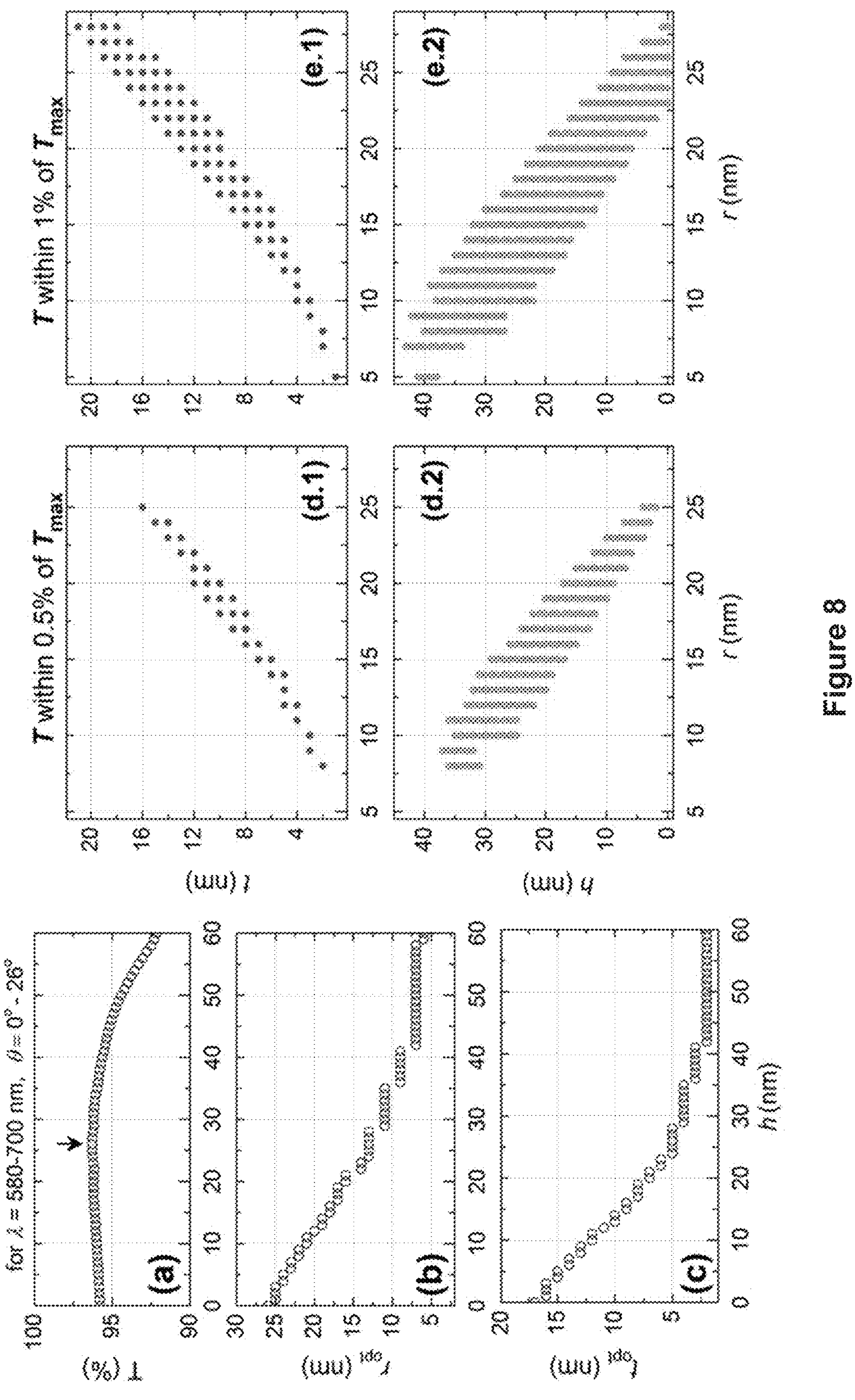
FIG. 8 shows the same as FIG. 4 but for close-packed (g=0 nm) hexagonal arrays of silica-coated silver NPs. (a-c) Optimal transmission and corresponding nanoshell parameters at each height of nanoshell array from the LED surface. The maximal transmittance (a), corresponding optimal core radius (b) and optimal shell thickness (c) at different heights. Yellow dots represent the optimum point of the maximum transmission ($T_{max}$=96.3%) at ($h_{opt}$=26 nm, $r_{opt}$=13 nm, $t_{opt}$=5 nm). (d,e) Different other combinations of shell thickness and height for a given core radius that allow transmission within 0.5% (d) and 1% (e) of $T_{max}$.

The process of optimizing transmittance over all permissible angles after including a layer 18' of core/shell nanoparticles 19' is then repeated for an LED with broad spectral emission range of 580-700 nm. FIGS. 8(*a-c*) plot the maximized transmittance at different heights and the corresponding optimal nanoparticle array parameters (in a similar manner to FIG. 4). The maximum transmission ($T_{max}$=96.3%, as against 83.9% without NPs) occurs for $r_{opt}$=13 nm and $t_{opt}$=5 nm at $h_{opt}$=26 nm, highlighted as yellow dots. FIGS. 8(*d*) and (*e*) depict the parametric spaces with all possible combinations of nanoparticle array parameters that would provide transmission within 0.5% (d) and 1% (e) of $T_{max}$. This would allow one to design the nanoparticle array to ensure the desired performance of the LED is achieved.

Figure 9:
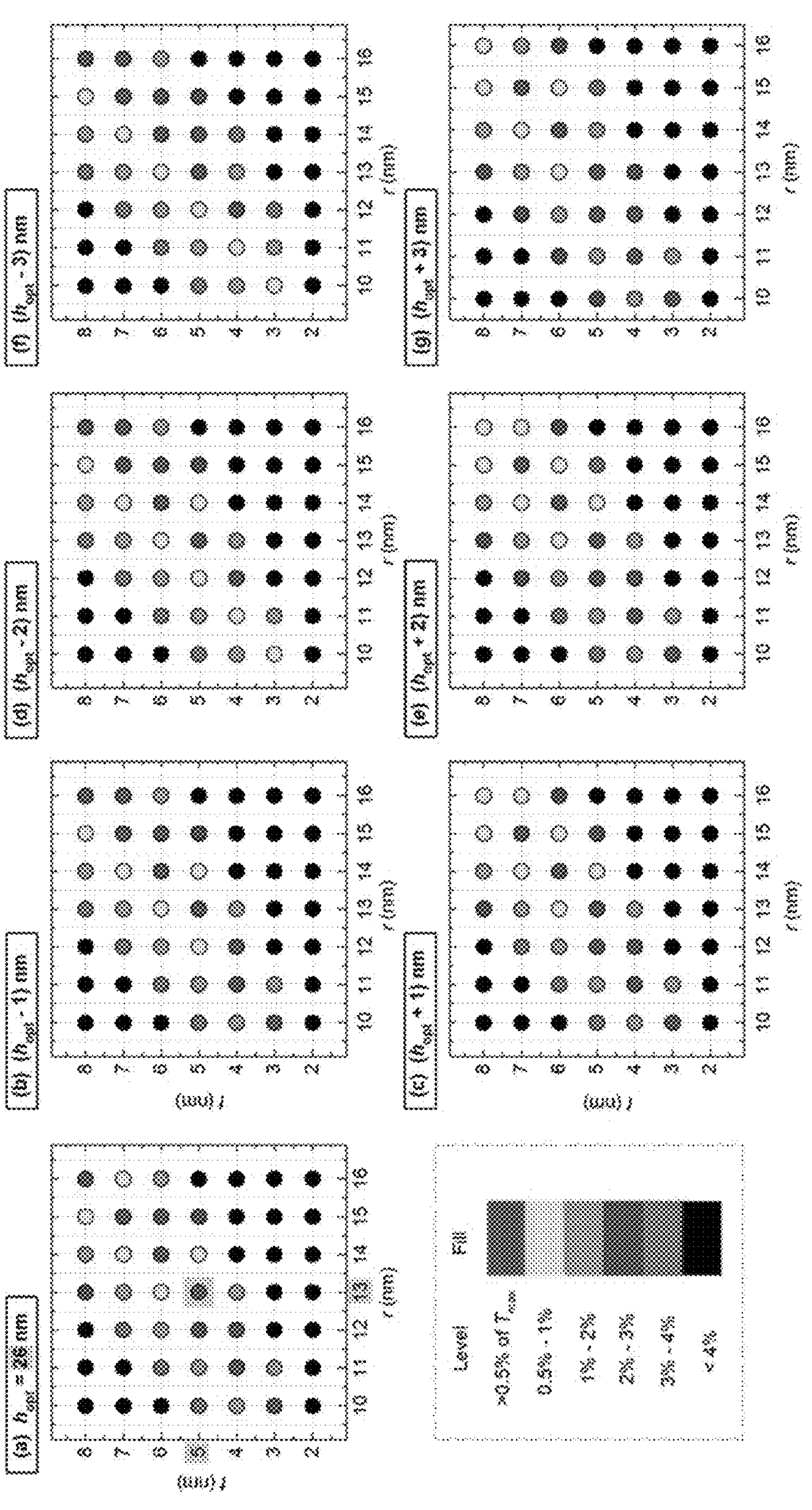
FIG. 9 shows the same as FIG. 5 but for close-packed (g=0 nm) hexagonal arrays of silica-coated silver NPs. (a) A 2 D map of transmittance in the r-t plane, where the maximum transmission ($T_{max}$) of 96.3% (as against 83.9% without NPs) is achieved at ($r_{opt}$=13 nm, $t_{opt}$=5 nm) at optimal height $h_{opt}$=26 nm (highlighted in purple). Dots with different colour levels depicting deviation from $T_{max}$ at fixed height of $h_{opt}$ but with changes in core radius r and shell thickness t, where both these parameters are assumed to be larger/smaller by 3 nm from their optimal values. (b-g) Same as in (a), but at different heights of ($h_{opt}$−1), ($h_{opt}$+1), ($h_{opt}$−2), ($h_{opt}$+2), ($h_{opt}$−3), ($h_{opt}$+3), respectively.

FIG. 9(*a*) shows the transmittance levels in a 2 D map in r-t plane with ($r_{opt}$, $t_{opt}$) at the centre, for fixed height of $h_{opt}$, obtained at all combinations for $r_{opt}$+/−3 nm and $t_{opt}$+/−3 nm (in a similar manner to FIG. 5). The dots at different (r,t) coordinates in the 2 D map are filled with different colours, which indicate the percentage deviation from $T_{ma}$, in each case. This reveals how sensitive the optimal transmission is to the deviations in core radius r and shell thickness t. Similar 2 D maps are also plotted for different h—ranging from $h_{opt}$−3 nm to $h_{opt}$+3 nm (see FIGS. 9(*b-g*)).

This would ensure that using an NP meta-grid the desired target of enhanced light extraction from LEDs can still be achieved despite possible deviations from the optimal nanoparticle dimensions due to typical inaccuracies in nanoparticle fabrication processes.

In practice, for any given wavelength of LED, following the above approach (which may be considered to be a preparatory process prior to manufacture) an optimum set of parameters for the coated nanoparticle array 18' may be found, in respect of:

The radius r of the core nanoparticles 19*a*—typically in the range of 5 nm to 30 nm, with optimum values $r_{opt}$ typically in the range of 5 nm to 25 nm, particularly in the range of 10 nm to 20 nm.

The coating thickness t of the shell layer 19*b*—typically in the range of 1 nm to 30 nm, with optimum values $t_{opt}$ typically in the range of 2 nm to 25 nm, particularly in the range of 4 nm to 15 nm.

The height h of the nanoparticle array 18' from the surface of the LED chip 14—typically in the range of 0 nm to 500 nm, with optimum values $h_{opt}$ typically in the range of 5 nm to 50 nm, particularly in the range of 20 nm to 40 nm.

For the design of an NP meta-grid to maximize light extraction efficiency from any LED, all different possible combinations of plasmonic nanoparticles can be considered and optimized accordingly. Plasmonic sub-wavelength nanoparticles of different shapes (preferably isotropic), sizes and composition, with different packing patterns in self-assembly (which mainly depends on their shape), can also be chosen to form a monolayer with sub-wavelength gap between the particles.

Advantages

Unlike prior attempts, the present invention deploys a monolayer array 18/18' of sub-wavelength metallic (plasmonic) nanoparticles (NPs) 19/19' acting as a 'meta-grid' to be positioned on top of the conventional LED chip 14, placed within the chip's usual encapsulating packaging 12. This significantly improves the light extraction efficiency by drastically reducing the Fresnel loss, by virtue of localized-surface-plasmon-enhanced light transmission through an optimized NP 'meta-grid' 18/18', resulting in an increase of the LED light extraction efficiency by ~15-18%. This also reduces internal heating of the LED chip 14, caused by reabsorption of the reflected light. Thus the present invention confers an additional benefit of boosting the device's lifetime, as well as increasing its light extraction efficiency, by introducing one additional layer (NP array 18/18') within the otherwise conventional LED design, which can easily be incorporated in existing LED manufacturing processes.

The present method of optimizing the structural configurations of the NP meta-grid 18/18' (including NP size, shape, composition, inter-particle gap, packing pattern while forming the array and the height from the LED chip surface) for plasmon-mediated transmission enhancement is applicable for any LED semiconductor material, with any spectral width and peak wavelength of its emission spectrum, and with any encapsulant material. The present work also provides estimates of the enhanced light transmission in the cases of possible deviations from the optimal NP dimensions, due to any typical inaccuracies prevalent in a nanoparticle fabrication process. It also lists the ranges of all possible NP dimensions over which the NP meta-grid 18/18' can still produce acceptable enhancement (not fewer than 0.5% or 1% of the best possible case) in light extraction from the LEDs.

Modifications and Alternatives

Detailed embodiments and some possible alternatives have been described above. As those skilled in the art will appreciate, a number of modifications and further alternatives can be made to the above embodiments whilst still benefiting from the inventions embodied therein.

Summary of Innovative Concepts and Advantages

1. Significant enhancement of the light extraction efficiency of an LED emission, achievable through introducing a layer of sub-wavelength metallic nanoparticles (NPs) with sub-wavelength inter-NP gaps on top of the LED chip, with the emergence of localized surface plasmon enhanced light transmission through the NP 'meta-grid'.

2. Determination of conditions on the structure and properties of the NP layer, including the material and composition of NPs, their sizes and average inter-particle spacing, along with the distance from the surface of the LED chip, which can provide the maximum enhancement of light extraction from LED chip for its different emission wavelengths.

3. One embodiment uses silver as the plasmonic metal for the spherical nanoparticles. Use of other alternative plasmonic metals such as gold, aluminium, copper etc., as well as more complicated composite materials or core-shell combinations, is also possible.

4. Another embodiment uses specific core/shell nanoparticles with silica coated silver nanospheres, for example, for precise control of the interparticle core-to-core spacing in densely packed arrays. Other alternative plasmonic materials mentioned in point 3 above can be used for the core while other insulating coating material of low refractive index, such as metal-oxides, sulphides, nitrides or fluorides can be used as the shell.

5. Instead of nanospheres, sub-wavelength plasmonic nanoparticles of other shapes, coated or uncoated, can also be used to form a monolayer, with any packing pattern, based on the optimal configuration obtained.

6. The local dielectric material on and around the NPs and in the gaps between the NPs could be any optically transparent material with refractive index similar or close to that of the encapsulant.

7. The method of plasmon-mediated transmission enhancement shown herein is applicable for any LED semiconductor material, emitting at any peak wavelength with any finite width, and with any encapsulant material. The theoretical model underlying this invention can optimize the NP meta-grid configurations (including NP size, shape, composition, inter-particle gap, packing pattern in self-assembly and height from the LED chip) for each specific case.

8. Analysis of the enhanced light transmission in the cases of possible deviations from the optimal NP dimensions found in points 2 and 5 above, due to any typical inaccuracies prevalent in the nanoparticle fabrication process, which shows the tolerance to variations in production.

9. Provide ranges of all possible NP dimensions over which the NP meta-grid can still produce acceptable enhancement (not fewer than 0.5% or 1% of the best possible case found in points 2 and 5 above) in light extraction from LEDs.

10. Simplicity of fabrication of the system, in that it requires only one additional step in existing LED manufacturing processes.

11. Two alternative principles for providing the structures capable of maximizing light extraction efficiency:

(a) Drying-mediated self-assembly of nanoparticles (e.g. plasmonic nanoparticles capped with appropriate ligands), forming 'plasmene' sheets, on a stretchable substrate (ideally of the same encapsulant material, or one that has a refractive index as close as possible to that of the encapsulant material) for precise tuning of inter-particle gap or spacing; to be stamped on the LED chip before the encapsulating casing is inserted. The distance of the nanoparticle array from the LED chip surface is controlled through the thickness of the plasmene's substrate.

(b) Spin coated assembly of metallic-core/dielectric-shell nanoparticles forming close-packed grid on top the LED chip; with inter-particle spacing controlled by the shell thickness. The distance of the array from the LED chip surface is controlled independently by regulated deposition of the encapsulating material on the LED chip before spin-coating the nanoparticle array.

12. The design of nanoparticle meta-grid can be optimized by tuning plasmonic coupling between the NPs to match the peak and spectral width of the LED emission, thus maximizing light extraction over all permissible angles below the critical angle of the interface between the LED chip and its encapsulating material.

13. As the proposal dramatically reduces the Fresnel loss by curbing reflection due to plasmon-mediated enhanced transmission through the NP meta-grid, the internal heating of the LED chip from reabsorption of the reflected light can thus be minimized This will help in boosting the device lifetime.

14. The present design and operation of the nanoparticle meta-grid for enhanced light extraction are substantiated by complete originally developed theory, tested against standard full-wave simulations.

REFERENCES

1. Li, J. & Zhang, G. Q. Light-Emitting Diodes. 4, (Springer International Publishing, 2019).
2. Schubert, E. F. Light-Emitting Diodes. in Wiley Encyclopedia of Electrical and Electronics Engineering 1-10 (John Wiley & Sons, Inc., 2014). doi:10.1002/047134608X.W3144.pub2
3. High refractive index package material and a light emitting device encapsulated with such material, Pub. No.: U.S. Pat. No. 5,777,433, Pub. Date: Jul. 7, 1998
4. Light emitting diodes with improved light extraction efficiency, Pub. No.: US 2002/0030194 A1, Pub. Date: Mar. 14, 2002
5. Light emitting diode with gradient index layering, Pub. No.: U.S. Pat. No. 6,717,362 B1, Pub. Date: Apr. 6, 2004
6. Light-emitting devices utilizing nanoparticles, Pub. No.: U.S. Pat. No. 6,870,311 B2, Pub. Date: Mar. 22, 2005
7. Light-emitting diode incorporation the packing nano particles with high refractive index, Pub. No.: US 2008/0210965 A1, Pub. Date: Sep. 4, 2008
8. Light emitting device having a layer of photonic crystals and a region of diffusing material and method for fabricating the device, Pub. No.: U.S. Pat. No. 7,358,543 B2, Pub. Date: Apr. 15, 2008
9. LED with particles in encapsulant for increased light extraction and non-yellow off-state color, Pub. No.: U.S. Pat. No. 7,791,093 B2, Pub. Date: Sep. 7, 2010
10. Sikdar, D., & Kornyshev, A. A. (2016). Theory of tailorable optical response of two-dimensional arrays of plasmonic nanoparticles at dielectric interfaces. Scientific reports, 6(1), 1-16.

The invention claimed is:

1. A light emitting diode (LED) device comprising:
an LED chip having a light-emitting p-n junction therein, for emitting light with peak intensity at a given wavelength; and
an encapsulating casing adjacent to the LED chip;
wherein the LED device further comprises a two-dimensional meta-grid array of plasmonic metallic nanoparticles on top of the LED chip, within the casing, wherein the metallic nanoparticles are less than said wavelength in diameter and have an inter-particle separation that is less than said wavelength;
wherein the metallic nanoparticles are arranged to couple to light emitted from the LED chip in use, and to act as resonant plasmonic antennae or scatterers for the emitted light,
wherein the metallic nanoparticles have a radius in the range of 5 nm to 50 nm; and
wherein adjacent metallic nanoparticles are spaced by an inter-particle gap, wherein the inter-particle gap is in the range of 2 nm to 150 nm.

2. The LED device according to claim 1, wherein the metallic nanoparticles comprise silver, gold, aluminium or copper.

3. The LED device according to claim 1, wherein the radius of the metallic nanoparticles is in the range of 5 nm to 40 nm.

4. The LED device according to claim 1, wherein the inter-particle gap is in the range of 5 nm to 80 nm.

5. The LED device according to claim 1, wherein the array of metallic nanoparticles is disposed at a height above a surface of the LED chip, within the casing, wherein the height is in the range of 5 nm to 50 nm.

6. The LED device according to claim 1, wherein the metallic nanoparticles in the array are each coated or functionalized with ligands to cause the nanoparticles to adopt an inter-particle gap spacing when the array is formed.

7. The LED device according to claim 1, wherein a dielectric material is disposed around and between the nanoparticles, optionally wherein the dielectric material is the same as the material from which the casing is formed.

8. The LED device according to claim 1, wherein the metallic nanoparticles in the array are each coated with a dielectric shell, thereby forming an array of coated nanoparticles, each coated nanoparticle comprising a core nanoparticle with a respective shell layer.

9. The LED device according to claim 8, wherein the coated nanoparticles are close-packed in the array.

10. The LED device according to claim 8, wherein the dielectric shell is formed of silica.

11. The LED device according to claim 8, wherein the core nanoparticles have a radius in the range of 5 nm to 30 nm, optionally wherein the radius is in the range of 5 nm to 25 nm, for example in the range of 10 nm to 20 nm.

12. The LED device according to claim 8, wherein the shell layer has a thickness in the range of 1 nm to 30 nm, optionally wherein the thickness is in the range of 2 nm to 25 nm, for example in the range of 4 nm to 15 nm.

13. The LED device according to claim 8, wherein the array of coated nanoparticles is disposed at a height above a surface of the LED chip, within the casing, wherein the height is in the range of 0 nm to 500 nm, optionally wherein the height is in the range of 5 nm to 50 nm, for example in the range of 20 nm to 40 nm.

14. The LED device according to claim 3, wherein the radius of the metallic nanoparticles is in the range of 10 nm to 20 nm.

15. The LED device according to claim 4, wherein the inter-particle gap is in the range of 10 nm to 40 nm.

16. The LED device according to claim 5, wherein the height is in the range of 20 nm to 40 nm.

* * * * *